(12) United States Patent
Smith

(10) Patent No.: US 9,275,753 B2
(45) Date of Patent: Mar. 1, 2016

(54) CIRCUIT AND METHOD FOR REDUCING WRITE DISTURB IN A NON-VOLATILE MEMORY DEVICE

(71) Applicant: SIDENSE CORP., Ottawa (CA)

(72) Inventor: Steven Smith, Wakefield (CA)

(73) Assignee: SIDENSE CORP., Ottawa (CA)

( * ) Notice: Subject to any disclaimer, the term of this patent is extended or adjusted under 35 U.S.C. 154(b) by 0 days.

(21) Appl. No.: 13/896,712

(22) Filed: May 17, 2013

(65) Prior Publication Data

US 2013/0308365 A1  Nov. 21, 2013

Related U.S. Application Data

(60) Provisional application No. 61/648,717, filed on May 18, 2012.

(51) Int. Cl.
*G11C 17/18* (2006.01)
*G11C 17/16* (2006.01)

(52) U.S. Cl.
CPC ............ *G11C 17/18* (2013.01); *G11C 17/16* (2013.01)

(58) Field of Classification Search
CPC .............................. G11C 17/18; G11C 7/00
USPC ................ 365/96, 185.25, 203, 104
See application file for complete search history.

(56) References Cited

U.S. PATENT DOCUMENTS 6,049,494 A * 4/2000 Sakui et al. ............... 365/203
6,421,293 B1 7/2002 Candelier et al.

FOREIGN PATENT DOCUMENTS

CA  2578837        5/2007
CA  2578837 C  *  12/2008

OTHER PUBLICATIONS

International Patent Application No. PCT/CA2013/050383, International Search Report and Written Opinion dated Aug. 1, 2013.

* cited by examiner

*Primary Examiner* — Son Mai
*Assistant Examiner* — Muna A Techane
(74) *Attorney, Agent, or Firm* — Shin Hung; Borden Ladner Gervais LLP

(57) ABSTRACT

An active precharge circuit for a non-volatile memory array which minimizes write disturb to non-selected memory cells during programming is disclosed. In a programming cycle, all bitlines are pre-charged to a program inhibit voltage level and held at the program inhibit voltage level with current or voltage sources coupled to each of the bitlines in a precharge operation and a following programming operation. In the programming operation, a bitline connected to a memory cell to be programmed is driven to a programming level, such as VSS, while the active precharge circuit is enabled to enable programming thereof. Because the other non-selected bitlines are held at the program inhibit voltage level, they will not be inadvertently programmed when the programming voltage is supplied by the word line.

11 Claims, 11 Drawing Sheets

CIRCUIT AND METHOD FOR REDUCING WRITE DISTURB IN A NON-VOLATILE MEMORY DEVICE

CROSS REFERENCE TO RELATED APPLICATIONS

This application claims the benefit of priority of U.S. Provisional Patent Application No. 61/648,717 filed on May 18, 2012, which is incorporated herein by reference.

FIELD

The invention is directed to non-volatile memories. More specifically, the invention is directed to reducing write disturb during programming of non-volatile memory cells.

BACKGROUND

Anti-fuse memory is one type of one-time programmable (OTP) memory in which the device can be permanently programmed (electrically) with data once. This data is programmed by an end user for a particular application. There are several types of OTP memory cells which can be used. OTP memories provide users with a level flexibility since any data can be programmed.

Anti-fuse memory can be utilized in all one time programmable applications where it is desired to provide pre-programmed information to a system, in which the information cannot be modified. One example application includes radio frequency identification (RF-ID) tags. RF-ID tagging applications are gaining more acceptance in the industry, particularly in sales, security, transport, logistics, and military applications for example. The simplicity and full complementary metal-oxide-semiconductor (CMOS) compatibility of anti-fuse memory allows for application of the RF-ID tag concept to integrated circuit manufacturing and testing processes.

FIG. 1 is a circuit diagram illustrating the basic concept of an anti-fuse memory cell, while FIGS. 2 and 3 show the planar and cross-sectional views respectively, of the anti-fuse memory cell shown in FIG. 1. The memory cell of FIG. 1 includes a pass, or access transistor 10 for coupling a bitline BL to a bottom plate of anti-fuse device 12. A wordline WL is coupled to the gate of access transistor 10 to turn it on, and a cell plate voltage Vcp is coupled to the top plate of anti-fuse device 12 for programming anti-fuse device 12.

It can be seen from FIGS. 2 and 3 that the layout of access transistor 10 and anti-fuse device 12 is very straight-forward and simple. The gate 14 of access transistor 10 and the top plate 16 of anti-fuse device 12 are constructed with the same layer of polysilicon, which extend across active area 18. In the active area 18 underneath each polysilicon layer is formed a thin gate oxide 20, also known as a gate dielectric, for electrically isolating the polysilicon from the active area underneath. On either side of gate 14 are diffusion regions 22 and 24, where diffusion region 24 is coupled to a bitline. Although not shown, those of skill in the art will understand that standard CMOS processing, such as sidewall spacer formation, lightly doped diffusions (LDD) and diffusion and gate silicidation, can be applied. While the classical single transistor and capacitor cell configuration is widely used, a transistor-only anti-fuse cell is further desirable due to the semiconductor array area savings that can be obtained for high-density applications. Such transistor-only anti-fuses must be reliable while simple to manufacture with a low cost CMOS process.

FIG. 4a shows a cross-sectional view of an anti-fuse transistor that can be manufactured with any standard CMOS process. Variants of this anti-fuse transistor are described in commonly owned U.S. patent application Ser. No. 11/762,552, filed on Jun. 13, 2007, now issued as U.S. Pat. No. 7,755,162 the contents of which are incorporated herein by reference. In the presently shown example, the anti-fuse transistor is almost identical to a simple thick gate oxide, or input/output metal oxide semiconductor (MOS) transistor with one floating diffusion terminal. The disclosed anti-fuse transistor, also termed a split-channel capacitor or a half-transistor, can be reliably programmed such that the fuse link between the polysilicon gate and the substrate can be predictably localized to a particular region of the device. The cross-section view of FIG. 4a is taken along the channel length of the device, which in the presently described example is a p-channel device.

Anti-fuse transistor 26 includes a variable thickness gate oxide 28 formed on the substrate channel region 30, a polysilicon gate 32, sidewall spacers 34, a field oxide region 36, a diffusion region 38 and a LDD region 40 in the diffusion region 38. A bitline contact 42 is shown to be in electrical contact with diffusion region 38. The variable thickness gate oxide 28 consists of a thick oxide and a thin gate oxide such that a portion of the channel length is covered by the thick gate oxide and the remaining portion of the channel length is covered by the thin gate oxide. Generally, the thin gate oxide is a region where oxide breakdown can occur. The thick gate oxide edge meeting diffusion region 38 on the other hand, defines an access edge where gate oxide breakdown is prevented and current between the gate 32 and diffusion region 38 is to flow for a programmed anti-fuse transistor. While the distance that the thick oxide portion extends into the channel region depends on the mask grade, the thick oxide portion is preferably formed to be at least as long as the minimum length of a high voltage transistor formed on the same chip.

In this example, the diffusion region 38 is connected to a bitline through a bitline contact 42, or other line for sensing a current from the polysilicon gate 32, and can be doped to accommodate programming voltages or currents. This diffusion region 38 is formed proximate to the thick oxide portion of the variable thickness gate oxide 28. To further protect the edge of anti-fuse transistor 26 from high voltage damage, or current leakage, a resistor protection oxide (RPO), also known as a salicide protect oxide, can be introduced during the fabrication process to further space metal particles from the edge of sidewall spacer 34. This RPO is preferably used during the salicidiation process for preventing only a portion of diffusion region 38 and a portion of polysilicon gate 32 from being salicided. It is well known that salicided transistors are known to have higher leakage and therefore lower breakdown voltage. Thus having a non-salicided diffusion region 38 will reduce leakage. Diffusion region 38 can be doped for low voltage transistors or high voltage transistors or a combination of the two resulting in same or different diffusion profiles.

A simplified plan view of the anti-fuse transistor 26 is shown in FIG. 4b. Bitline contact 42 can be used as a visual reference point to orient the plan view with the corresponding cross-sectional view of FIG. 4a. The active area 44 is the region of the device where the channel region 30 and diffusion region 38 are formed, which is defined by an OD mask during the fabrication process. The dashed outline 46 defines the areas in which the thick gate oxide is to be formed via an OD2 mask during the fabrication process. More specifically, the area enclosed by the dashed outline 46 designates the regions where thick oxide is to be formed. OD simply refers to an oxide definition mask that is used during the CMOS process for defining the regions on the substrate where the oxide is to be formed, and OD2 refers to a second oxide definition mask different than the first. Details of the CMOS process steps for fabricating anti-fuse transistor 26 are discussed in previously mentioned U.S. Pat. No. 7,755,162. In one embodiment, the thin gate oxide area bounded by edges of the active area 44 and the rightmost edge of the OD2 mask is minimized. In the presently shown embodiment, this area can be minimized by shifting the rightmost OD2 mask edge towards the parallel edge of active area 44. Previously mentioned U.S. Pat. No. 7,755,162 describes alternate single transistor anti-fuse memory cells which can be used in a non-volatile memory array.

FIG. 5 is a simplified schematic of a non-volatile memory array 50 which uses the previously described anti-fuse device, wherein each memory cell 51 comprises an instance of the anti-fuse device. Programming of a selected memory cell 51 is achieved by biasing a bitline 52 connected to the selected memory cell 51 to a program enabling voltage, such as VSS by example. To prevent programming of a selected memory cell 51 and/or non-selected memory cells 51, the bitline 52 is biased to a program inhibiting voltage, such as a positive voltage by example. For this purpose, the bitlines 52 are connected to N channel precharge devices 59 receiving PCH 53 and the precharge voltage VPCH 54. It is noted that VPCH can be set to different voltage levels for program and read cycles. VPCH can be set to a program inhibit voltage level, which in the present embodiments can be a high voltage level sufficient for inhibiting programming of non-selected memory cells. For read cycles, VPCH can be set to a voltage level lower than the program inhibit voltage level.

In FIG. 5, PCH 53 is activated for a short period of time in a precharge operation of a programming cycle to couple all the bitlines 52 to precharge voltage VPCH 54. It should be understood that a programming cycle includes a precharge operation followed by a programming operation to program data to cells addressed by a row and column address. Subsequent programing cycles can be executed for either re-programming the same cells or for programming different cells. Then all the bitlines 52 float when precharge devices 59 are turned off. Then one of the column select devices 55 is turned on by activating one of the column select signals Y[0] to Y[7] to couple the selected bitline 52 to BLSA 56, which is biased by sense amplifier (SA) 58 to VSS. For read operations, sense amplifier 58 compares the voltage of BLSA from the selected bitline to a reference voltage carried on line BLSAb. In program operations, sense amplifier 58 is configured to bias the selected bitline to VSS or VDD depending on the write data. In alternate configurations, a separate write circuit can be used to provide the write data to the selected bitline. An isolation device 61 is also provided selectively to connect BLSA 56 commonly to the column select devices 55. In the programming operation, a selected word line 57 is driven to a programming voltage level. Accordingly, the memory cell 51 connected to the selected word line 57 at the programming voltage level and the bitline 52 at VSS will be programmed. Conversely, any memory cell 51 connected to the selected word line 57 and a bitline 52 at VPCH 54 should be inhibited from being programmed.

The problem with this scheme is that the non-selected bitlines having been pre-charged to the VPCH level will experience leakage through various sources. This means that the VPCH level will decay, or slowly discharge, towards VSS. Hence the non-selected bitlines may not be fully inhibited from being programmed when the word line is driven to the programming voltage level. Therefore non-selected memory cell may be inadvertently programmed. This is referred to as write disturb.

FIG. 6 is a timing diagram showing schematically the bitline voltages for non-selected bitlines and a selected bitline not to be programmed in a programming cycle for the circuit of FIG. 5. Signal traces for the PCH signal, selected and non-selected column select signals Y, the ISOL signal, a selected bitline to be programmed, a selected bitline inhibited from being programmed, and a non-selected bitline are shown. It is noted that the timing diagram signal traces are not drawn to scale, and the bitline voltage signal traces are drawn with an enlarged scale relative to the other shown signals in order to better illustrate the voltage changes occurring therein.

As shown in the diagram, the PCH signal is pulsed to the active logic high level for precharging all the bitlines as part of the precharge operation of the programming cycle. In the presently shown example of FIG. 6, the bitlines can be precharged to a read precharge voltage of about Vx-Vt in preparation for a read operation, or to about VCC-Vt in preparation for a programing operation. Both levels are illustrated in FIG. 6. During the high PCH pulse, the column select signals Y are at the inactive low logic level to keep the column select devices 55 turned off. Signal ISOL is also at the inactive low logic level during the PCH pulse to keep isolation device 61 turned off. It is assumed during this time that the sense amplifier 58 has been loaded with write data having either a high or low logic level.

At the end of the PCH pulse the precharge operation ends and the program operation commences with a selected Y column select signal driven to the high logic level as shown in the solid black line, while non-selected Y column select signals remain at the low logic level as shown in the dashed line. At about the same time, ISOL is driven to the high logic level to connect BLSA 56 to the selected bitline via the selected Y column select signal. If programming is required for the cell connected to the selected bitline, BLSA is at the low logic level to drive the selected bitline to VSS as shown by the dashed line. Otherwise if no programming is required, then the selected bitline voltage decays from the VCC-Vt precharge voltage to about VDD-Vt as shown by the solid line. In this particular example embodiment, the VDD-Vt voltage is provided by the sense amplifier. However, the initially precharged non-selected bitlines will decay towards VSS, and are therefore susceptible to erroneous and undesirable programming, or write disturb when the selected wordline is driven. In the present example, the non-selected bitlines will have decayed to VSS at about 1 µs, which is at least the time required for completion of a programming cycle in some examples.

The non-selected bitlines decay to these levels because of bitline leakage. In the presently shown example timing diagram, VCC is the IO supply voltage and can be 1.8V, 2.5V, or 3.3V by example, VDD is the core logic voltage and can be 0.9V, 1.0V, or 1.1V by example, and VX is the read voltage and can be in the range of 1.3V to 2.2V depending on the process by example. VX is derived from VCC and can be lower than VCC, but in alternate embodiments can be greater than VCC.

It is, therefore, desirable to provide a circuit and method for minimizing write disturb in OTP memories.

SUMMARY

It is an object of the present disclosure to obviate or mitigate at least one disadvantage of previous write disturb circuits and methods for non-volatile memory.

In a first aspect, there is provided a one-time programmable (OTP) memory including OTP memory cells connected to bitlines and wordlines, a precharge circuit and a write circuit. The precharge circuit biases non-selected bitlines at a program inhibit voltage in a programming operation. The write circuit is configured for driving a selected bitline to a voltage level for enabling programming of an OTP memory cell connected to the selected bitline when a selected wordline is driven to a programming voltage level. According to one embodiment of the present aspect, the precharge circuit includes an active precharge current source receiving the program inhibit voltage connected to each of the bitlines, and is configured to operate in a low current mode during a precharge operation prior to the programming operation, and to operate in the low current mode during the programming operation. Alternately, the precharge circuit is configured to operate in a high current mode during a precharge operation prior to the programming operation, and to operate in a low current mode during the programming operation in response to a controllable bias voltage. In this embodiment, the OTP memory includes a bias voltage generator configured to set the controllable bias voltage between a first voltage level in the high current mode and a second voltage level the low current mode, in response to an enable signal.

In another embodiment, the precharge circuit includes active precharge current sources receiving the program inhibit voltage, each being connected to one of the bitlines and configured to operate in a high current mode during a precharge operation prior to the programming operation, and to operate in a low current mode during the programming operation. In yet a further embodiment, the precharge circuit has connected to each bitline a first transistor device and a second transistor device. The first transistor device receives the program inhibit voltage in response to a controllable bias voltage, and the second transistor device couples the first transistor device to the bitline in response to a precharge signal. For this embodiment, a bias voltage generator can be configured to set the controllable bias voltage to a first voltage level in a high current mode and to a second voltage level in a low current mode, in response to an enable signal, where the first voltage level is a first supply voltage, and the second voltage level is between the first supply voltage and a second supply voltage. Alternately, the write circuit includes a sense amplifier for storing write data, the sense amplifier including discharge circuitry configured to overcome the first transistor device and the second transistor device operating in the low current mode.

In a second aspect, there is provided a method for accessing a memory cell of a one-time programmable (OTP) memory. The method includes actively maintaining non-selected bitlines at a precharge voltage, and executing a bitline access operation to access the memory cell connected to a selected bitline initially precharged to the precharge voltage. According to a first embodiment, the bitline access operation is a programming operation, and the precharge voltage is a program inhibit voltage. According to a second embodiment, the bitline access operation is a read operation, and the precharge voltage is a read precharge voltage.

In the first embodiment, the method further includes precharging all bitlines, including the selected bitline, to the program inhibit voltage in a precharge operation prior to maintaining the non-selected bitlines at the program inhibit voltage during the programming operation. This programming operation includes overwriting the program inhibit voltage of the selected bitline. The precharge operation can include driving all the bitlines with low current and the programming operation includes driving all the bitlines with the low current.

Alternately, the precharge operation can include driving all the bitlines with high current, and actively maintaining and the programming operation includes driving all the bitlines, including the selected bitline, with low current.

In the second embodiment, actively maintaining includes precharging all the bitlines for a predetermined period of time in a precharge operation prior to executing the read operation, and executing the read operation includes driving the selected bitline from the precharge voltage to a voltage supply level. Executing the read operation further includes driving a wordline connected to the memory cell after the selected bitline is at the voltage supply level.

Other aspects and features of the present disclosure will become apparent to those ordinarily skilled in the art upon review of the following description of specific embodiments in conjunction with the accompanying figures.

BRIEF DESCRIPTION OF THE DRAWINGS

Embodiments of the present disclosure will now be described, by way of example only, with reference to the attached Figures.

FIG. 4b is a planar layout of the variable thickness gate oxide anti-fuse transistor of FIG. 4a;

FIG. 8 is a schematic of a programmed anti-fuse transistor of FIG. 4a;

DETAILED DESCRIPTION

Generally, the present embodiments are directed to an active precharge circuit for a non-volatile memory array which minimizes write disturb to non-selected memory cells during programming to a selected memory cell connected to the same word line. The active precharge circuit may further minimize write disturb to selected memory cells not to be programmed, but which are connected to a word line to be driven to a programming voltage.

In a programming cycle, all bitlines are pre-charged to a program inhibit voltage level and held at the program inhibit voltage level with current or voltage sources coupled to each of the bitlines in a precharge operation and a following programming operation. In the programming operation, a bitline connected to a memory cell to be programmed is connected to a programming level, such as VSS, through column select devices to enable programming thereof. Because the other non-selected bitlines are held at the program inhibit voltage level, they will not be inadvertently programmed when the programming voltage is supplied by the word line.

Figure 7:
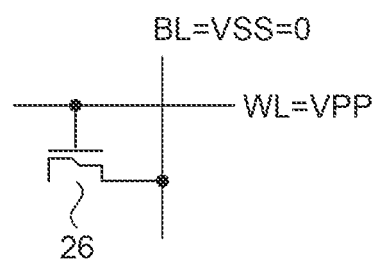
FIG. 7 is a schematic of the anti-fuse transistor of FIG. 4a under programming conditions.
Figure 8:
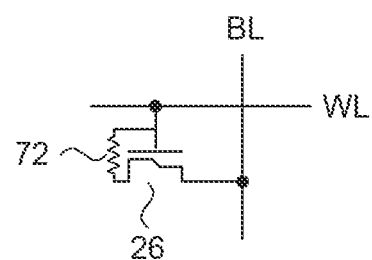

FIG. 7 is a schematic showing the interconnection of the previously described anti-fuse transistor 26 to a bitline and a word line. A successfully programmed anti-fuse transistor 26 is shown in FIG. 8, where a conductive link 72 is formed between the polysilicon gate and the channel region. Conductive link 72 is schematically represented as a resistive connection between the wordline and the channel region under the thin gate oxide region of anti-fuse transistor 26. Therefore a programmed anti-fuse transistor having a conductive link stores one logic state of one bit of data. Accordingly, an unprogrammed anti-fuse transistor will by default store the other logic state of one bit of data. To prevent programming of the anti-fuse transistor 26, the bitline is biased to a program inhibit voltage, which in one embodiment is VDD, while the wordline is driven to a programming voltage, which in one embodiment is VPP. This will be sufficient for inhibiting the conductive link from forming.

Figure 9:
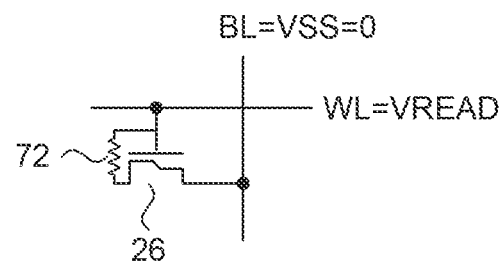
FIG. 9 is a schematic of a programmed anti-fuse transistor of FIG. 4a under read conditions.

Reading the anti-fuse transistor is achieved by driving the wordline to a read voltage VREAD, and by precharging the bitline to VSS, as shown in FIG. 9. If the anti-fuse transistor 26 has a conductive link 72, then the wordline will pull the bitline towards the VREAD voltage level via the conductive link 72 and the positive gate voltage of the anti-fuse transistor. This bitline voltage can be sensed and amplified by sense amplifier circuits. On the other hand, if the anti-fuse transistor 26 is not programmed, i.e. does not have a conductive link 72, then the bitline will remain at approximately VSS.

According to the present embodiments, the active precharge write disturb inhibit circuit keeps the non-selected bitlines pulled up to the program inhibit voltage of about VCC-Vt, VPP-Vt, VPP, or any predetermined voltage sufficient for the purposes of inhibiting programming of a non-selected memory cell connected to a selected wordline in the precharge and programming operations of a program cycle. This keeps the selected bitline associated with a cell that is not to be programmed pulled up to VCC-Vt, and allows the selected bitline associated with a cell that is to be programmed to be pulled to VSS while the active precharge write disturb inhibit circuit is actively providing current to the selected bitline. Furthermore, the active precharge write disturb inhibit circuit embodiments does not interfere with how the memory is read.

Figure 1:
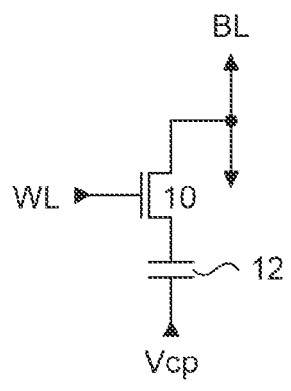
FIG. 1 is a circuit diagram of an anti-fuse memory cell.
Figure 2:
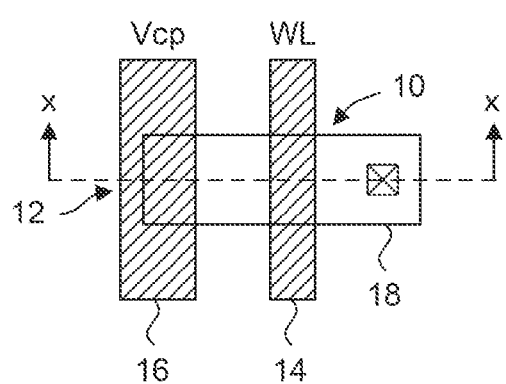
FIG. 2 is a planar layout of the anti-fuse memory cell of FIG. 1.
Figure 3:
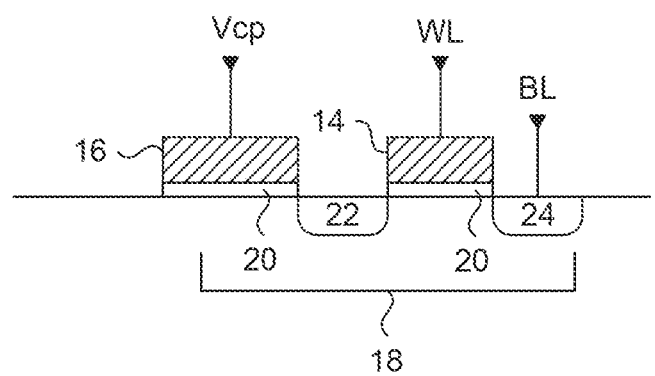
FIG. 3 is a cross-sectional view of the anti-fuse memory cell of FIG. 2 along line x-x.
Figure 4A:
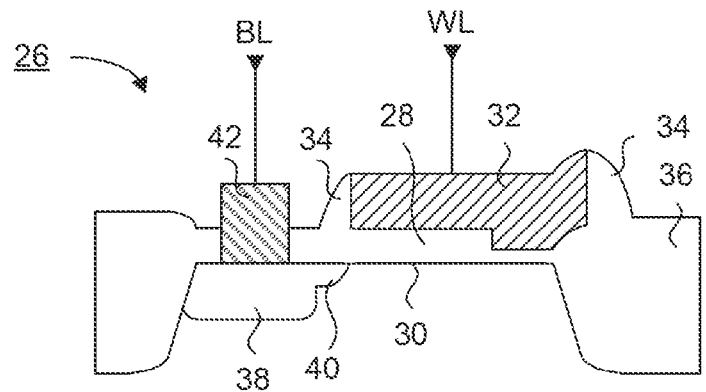
FIG. 4a is a cross-sectional view of a variable thickness gate oxide anti-fuse transistor.
Figure 4B:
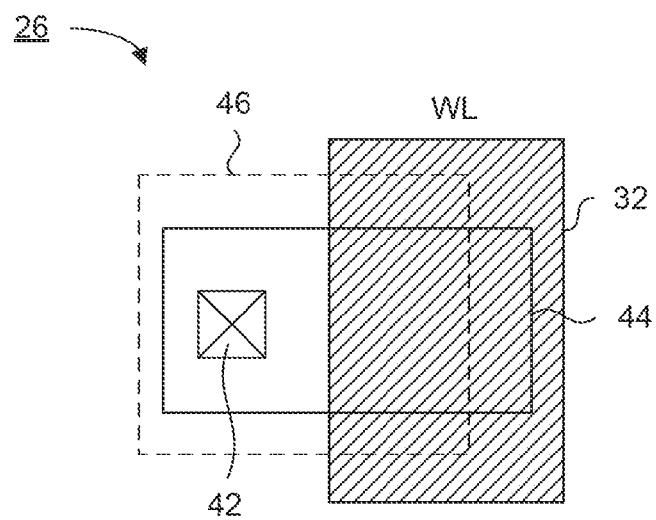
Figure 5:
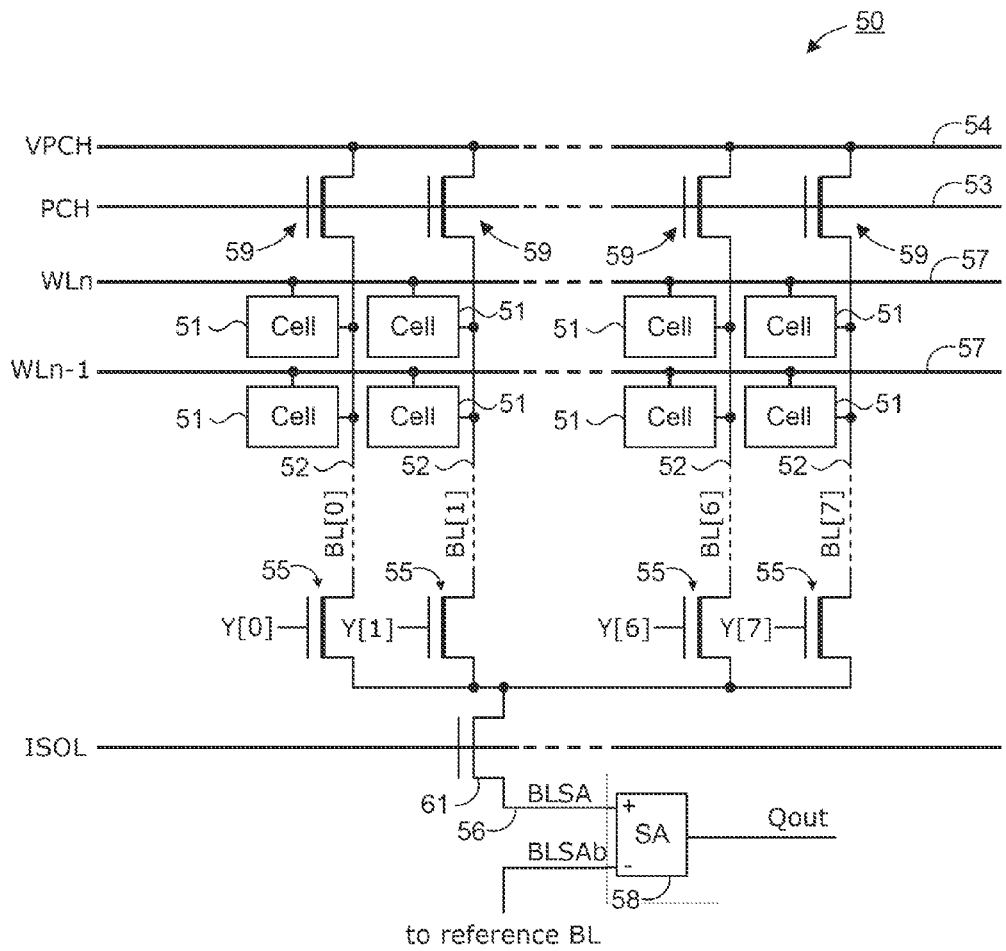
FIG. 5 is a simplified circuit schematic of a non-volatile memory device.
Figure 10:
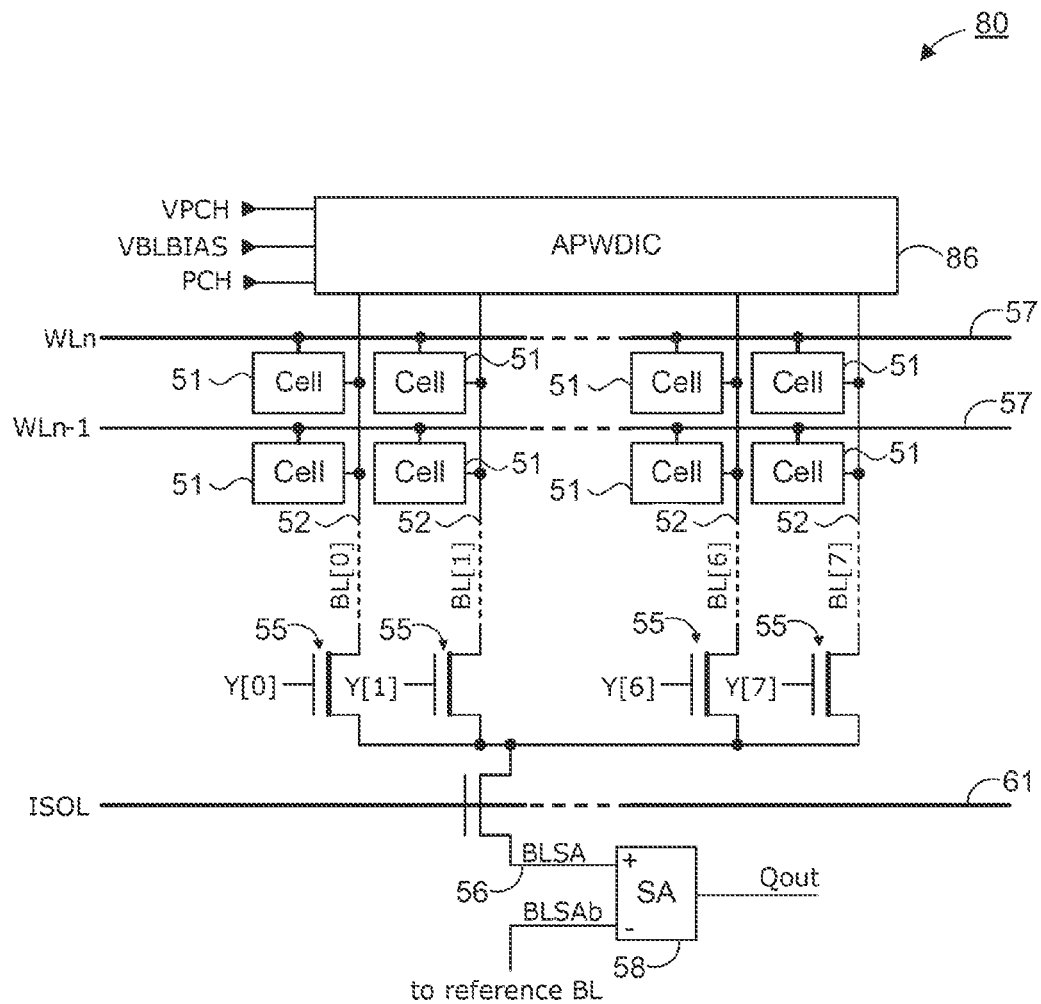
FIG. 10 is a simplified circuit schematic of a nonvolatile memory device having an active precharge write disturb inhibit circuit (APWDIC)

FIG. 10 is a simplified circuit schematic of a nonvolatile memory array 80 similar to the non-volatile memory array 50 shown in FIG. 5, but having an active precharge circuit, herein referred to as active precharge write disturb inhibit circuit (APWDIC) 86, according to one embodiment. The nonvolatile memory array 80 has programmable memory cells 51 arranged in rows, or word lines, and columns, or bitlines, configured for receiving a programming voltage. The memory array 80 further has column select devices 55 receiving column select signals Y[0] to Y[7] to couple a selected bitline 52 to BLSA 56, which is biased by sense amplifier (SA) 58 to a programming voltage, if a memory cell 51 connected to the selected bitline 52 is to be programmed, or to a program inhibiting voltage, if no memory cell 51 connected to the selected bitline 52 is to be programmed. In one embodiment, the programming voltage for BLSA 56 is VSS. The function of the APWDIC 86 is to connect to and maintain at a program inhibiting voltage any non-selected bitlines so as to inhibit programming of any memory cell 51 on that bitline 52. The APWDIC 86 is also configured to connect to and maintain at the program-inhibiting voltage, a selected bitline 52 which is not to be programmed.

In the present embodiment, APWDIC 86 receives a precharge voltage VPCH, a precharge signal PCH, and a controllable bias voltage VBLBIAS. The APWDIC 86 functions as a controllable current source. In the precharge operation of a programming cycle, PCH is activated and VBLBIAS is set to a first logic level to maximize precharge performance. In this high current mode, a maximum current from the APWDIC 86 is provided to all the bitlines in order to precharge the bitlines to about VCC-Vt as fast as possible. Then VBLBIAS is set to a bias voltage level such that just enough current is provided to compensate for bitline leakage, thereby holding all the bitlines at VCC-Vt. This is referred to as a low current mode of operation. Then in the following programming operation, the APWDIC 86 remains in the low current mode during programming, and the current provided APWDIC 86 is configured to allow the sense amplifier 58 to discharge a selected bitline to VSS to enable programming of the selected memory cell. Therefore, non-selected bitlines are held at the precharge voltage and the effects of bitline leakage are minimized.

Figure 11:
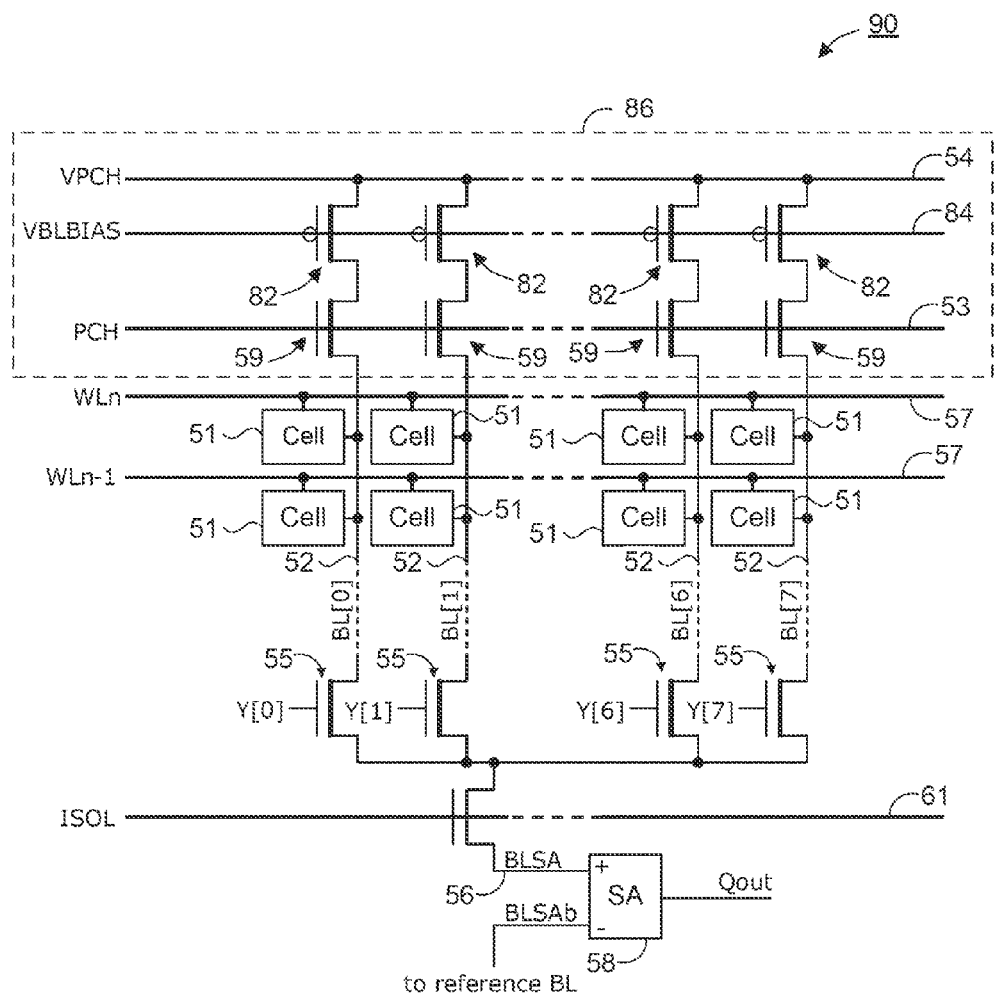
FIG. 11 is a simplified circuit schematic of the nonvolatile memory device of FIG. 10 showing an embodiment of the APWDIC.

One embodiment of the APWDIC 86 is illustrated in FIG. 11 which shows a nonvolatile memory array 90 similar to the non-volatile memory array 50 shown in FIG. 5. The APWDIC 86 includes the N channel precharge devices 59 receiving PCH 53 and the precharge voltage VPCH 54, which in one embodiment is the program-inhibiting voltage. The APWDIC 86 further includes P channel transistors 82 inserted between the N channel precharge devices 59 receiving PCH 53 and the precharge voltage VPCH 54. These additional precharge transistors 82 are driven by bias voltage VBLBIAS 84. Each pairing of a P channel transistor 82 and N channel precharge device 59 can be referred to as an active precharge current source for a corresponding bitline.

In the precharge operation of the programming cycle, PCH 53 is activated thereby turning on the N channel precharge devices 59, and VBLBIAS is set to a low logic level so as to enable the P channel devices 82. In this high current mode of operation, each active precharge current source quickly pulls its respective the bitline 52 to VPCH 54. After a predetermined time when the bitlines have reached the VPCH voltage level, which can be calibrated based on the circuit design and process used to fabricate the memory array, VBLBIAS is set to an intermediate voltage level between VCC and VSS in the low current mode of operation. The programming operation commences and the precharge operation ends when a column select device 55 corresponding to the selected bitline 52 is activated to connect the selected bitline 52 to BLSA 56 which is biased at a programming voltage, which in one embodiment is VSS, by the sense amplifier (SA) 58. Alternately, BLSA 56 can be set to a program inhibit voltage, which in one embodiment is VDD.

In this embodiment, the PCH signal 53 remains active during the programming operation. The sizing of P channel device 82 and the bias voltage level of VBLBIAS are configured such that the sense amplifier 58 can still discharge the bitline to VSS. In this situation, the sense amplifier 58 includes discharge circuitry which overcomes the P channel device 82 connected to the selected bitline 52, and the selected bitline 52 will be driven to and remains at VSS or other programming voltage. In other words, the sense amplifier overwrites the voltage provided by the active precharge current source connected to the selected bitline. In the meantime, all the non-selected bitlines will be held at about VPCH 54 due to the P channel devices 82 being on and their corresponding column select devices 55 being turned off. A selected word line 57 can now be driven to the programming voltage level to program the selected memory cell 51 connected to the bitline 52 driven to VSS by the sense amplifier 58. It is noted that setting VBLBIAS to the intermediate voltage can be done before the programming operation begins, or before the selected column select device is turned on. For the purposes of describing the present embodiments, the programming operation of the programming cycle begins when the selected column select device is activated.

Figure 12:
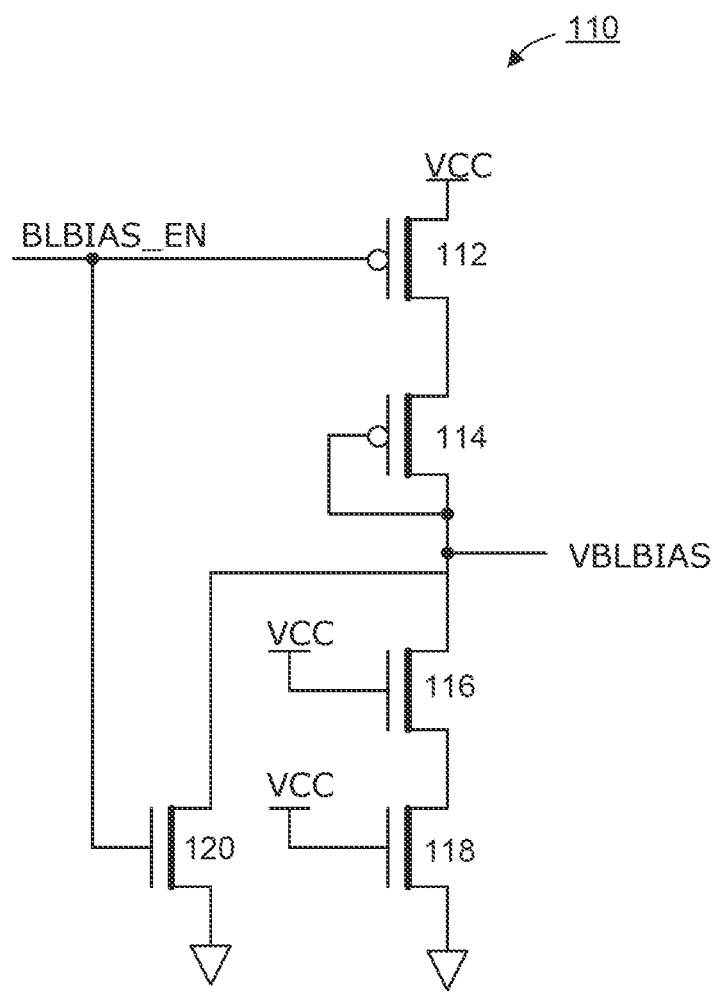
FIG. 12 is a circuit schematic of a bias voltage generator for the APWDIC shown in FIG. 11.

FIG. 12 is a circuit schematic of bias voltage generator 110 for the circuit shown in FIG. 11. This bias voltage generator 110 is designed to provide VBLBIAS, a voltage level sufficient to enable the P channel devices 82 of FIG. 11 to maintain the non-selected bitlines 52 at the VPCH 54 voltage level, while allowing BLSA 56 easily and quickly to override the P channel device 82 on the selected bitline 52 in order to set the selected bitline 52 to VSS or other programming voltage. The bias voltage generator 110 includes first and second P channel devices 112 and 114 connected in series between VCC and the VBLBIAS output node, and first and second N channel devices 116 and 118 connected in series between the VBLBIAS output node and VSS. Another N channel device 120 connects VBLBIAS directly to VSS. The gate terminals of transistor devices 112 and 120 receive enable signal BLBIAS_EN. Transistor device 114 is diode connected, and the gate terminals of transistor devices 116 and 118 are connected to VCC. Transistors devices 112, 114, 116 and 118 collectively function as a voltage divider circuit, where the number of devices, geometry and types can be tailored to set VBLBIAS to a particular voltage level.

In the high current mode of operation BLBIAS_EN is set to the high logic level to turn off P channel device 112, while turning on N channel device 120, to thereby connect VBLBIAS to VSS. The high current mode is used during the precharge operation of the programming cycle. In the low current mode of operation, BLBIAS_EN 116 is set to the low logic level to turn on P channel device 112 and to turn off N channel device 120. The low current mode is used at least during the programming operation of the programming cycle, but can also be used in an extended precharge operation of the programming cycle. These two modes of operation are used during programming operations, for keeping non-selected bitlines at or about the precharge voltage level to thereby prevent program disturb. During read operations on the other hand, BLBIAS_EN is set to the high logic level to set VBLBIAS at VSS. Further details of how this circuit and the APWDIC 86 operate for read operations is described later. The specific circuit embodiment of FIG. 12 is but one type of bias voltage generator which can be used. It will be appreciated, however, that any circuit capable of generating a VBLBIAS for causing the P channel devices 82 of FIG. 11 to provide the described functionality may be substituted for the above bias voltage generator 110.

Figure 13:
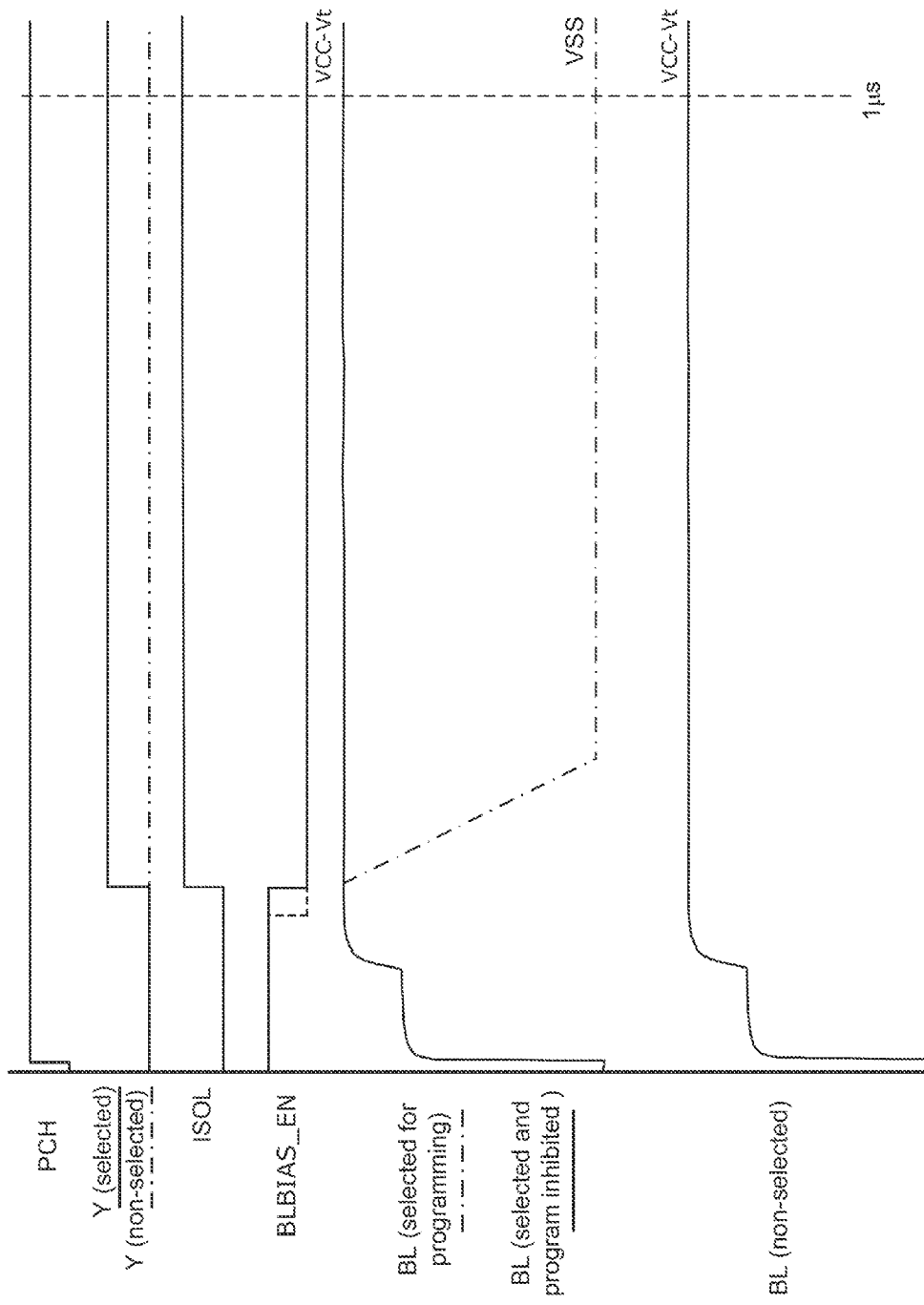
FIG. 13 is a timing diagram showing the precharge operation of the circuit embodiment of FIGS. 11 and 12 prior to programming data.

FIG. 13 is a timing diagram showing signal line traces for PCH, selected and non-selected column select signals Y, BLBIAS_EN, a selected bitline to be programmed, a selected bitline inhibited from being programmed, and a non-selected bitline, illustrating the operation of the circuit embodiment of FIG. 11. It is noted that the timing diagram signal traces are not drawn to scale, and the bitline voltage signal traces are drawn with an enlarged scale relative to the other shown signals in order to better illustrate the voltage changes occurring therein.

Figure 6:
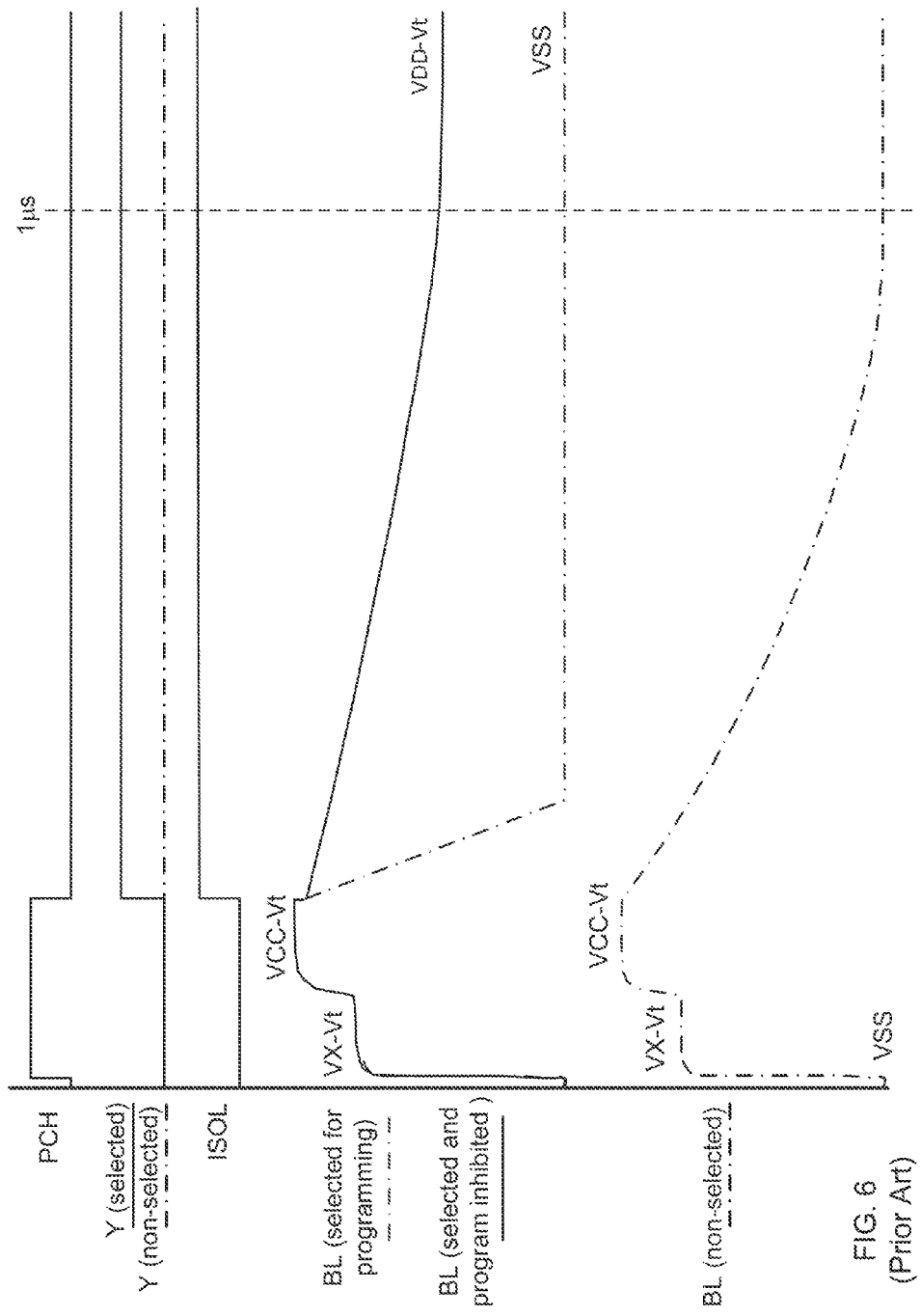
FIG. 6 is a timing diagram showing the precharge operation of the circuit of FIG. 5 prior to programming data.

This timing diagram shows that the active precharge write disturb inhibit circuit effectively maintains non-selected bitlines at the program inhibit voltage of VCC-Vt during the programming operation of the programming cycle. In the precharge operation, PCH is driven to the active high logic level and signal BLBIAS_EN is set to the high logic level so that APWDIC 86 and bias voltage generator 110 operate in the high current mode to quickly drive the bitlines to VPCH, which in the present example is VCC-Vt. At a predetermined time after the bitlines have reached VCC-Vt, BLBIAS_EN can be driven to the low logic level to switch operation of APWDIC 86 and bias voltage generator 110 to the low current mode. This can occur before or at the same time ISOL and a selected column select signal Y are activated. The dashed lines for BLBIAS_EN shows its fall to the low logic level before ISOL and a selected column select signal Y are activated. In the programming operation, ISOL and a selected column select signal Y are activated by being driven to the high logic level so that the selected bitline can be driven to VSS by the sense amplifier 58. As previously mentioned, the sense amplifier circuit discharge circuits are configured to overcome the active precharge current source operating in the low current mode for a corresponding bitline. For a selected bitline that is inhibited from being programmed, the active precharge current source maintains the selected bitline at VPCH. As shown in FIG. 13, non-selected bitlines are maintained at VPCH by the active precharge current source operating in the low current mode. Therefore, unlike non-selected bitlines in FIG. 6, the non-selected bitlines of FIG. 13 do not decay to a voltage level that results in unintentional programming of cells.

Figure 14:
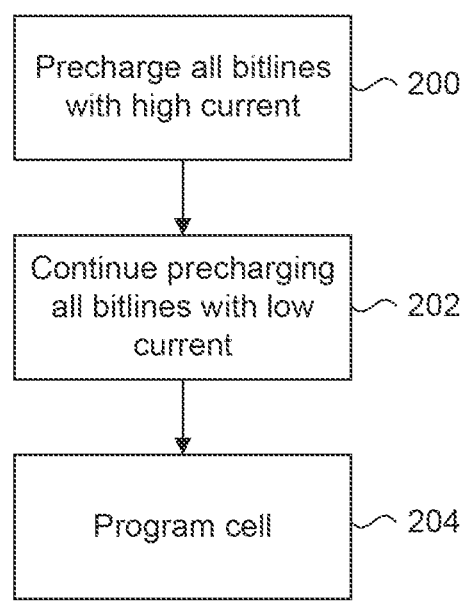
FIG. 14 is a flow chart of a method for programming data with active bitline precharge, according to an embodiment of the present invention; and, FIG. 15 is a timing diagram showing precharge operation of the circuit embodiment of FIGS. 11 and 12 prior to reading data.

FIG. 14 is a flow chart summarizing a method of minimizing program disturb in non-volatile memory. The method is executed for a programming cycle, and begins at 200 by precharging all the bitlines with high current in a precharge operation. In the embodiments of FIGS. 11 and 12 for example, BLBIAS_EN is set to the high logic level to bias VBLBIAS to VSS and PCH is set to the high logic level to quickly precharge the bitlines to VPCH. Once all the bitlines are precharged to VPCH, precharging continues in the programming operation at 202, but with low current. In the embodiments of FIGS. 11 and 12 for example, BLGIAS_EN is set to the low logic level to set VBLBIAS to the predetermined voltage level set by the arrangement and configuration of transistor devices 112, 114, 116 and 118. Following at 204, cell programming (or program inhibit) is executed in the programming operation, by biasing the selected bitline to the appropriate voltage level depending on the write data, and driving a selected wordline to a programming voltage level. In the embodiments of FIGS. 11 and 12 for example, this is done by loading the sense amplifier 58 with the write data, which is then coupled to the selected bitline via an activated column select device 55. In the present embodiments, a cell is programmed when the bitline is biased to VSS. When the programming operation is completed at 204, the method returns to 200 for the next program cycle, where a different cell may be programmed with new data. A program verify operation may be executed after the programming operation is completed at 204. Therefore, if the program verify operation indicates that cell was not successfully programmed, the same cell may be programmed again in a new programming cycle starting with step 200.

Figure 15:
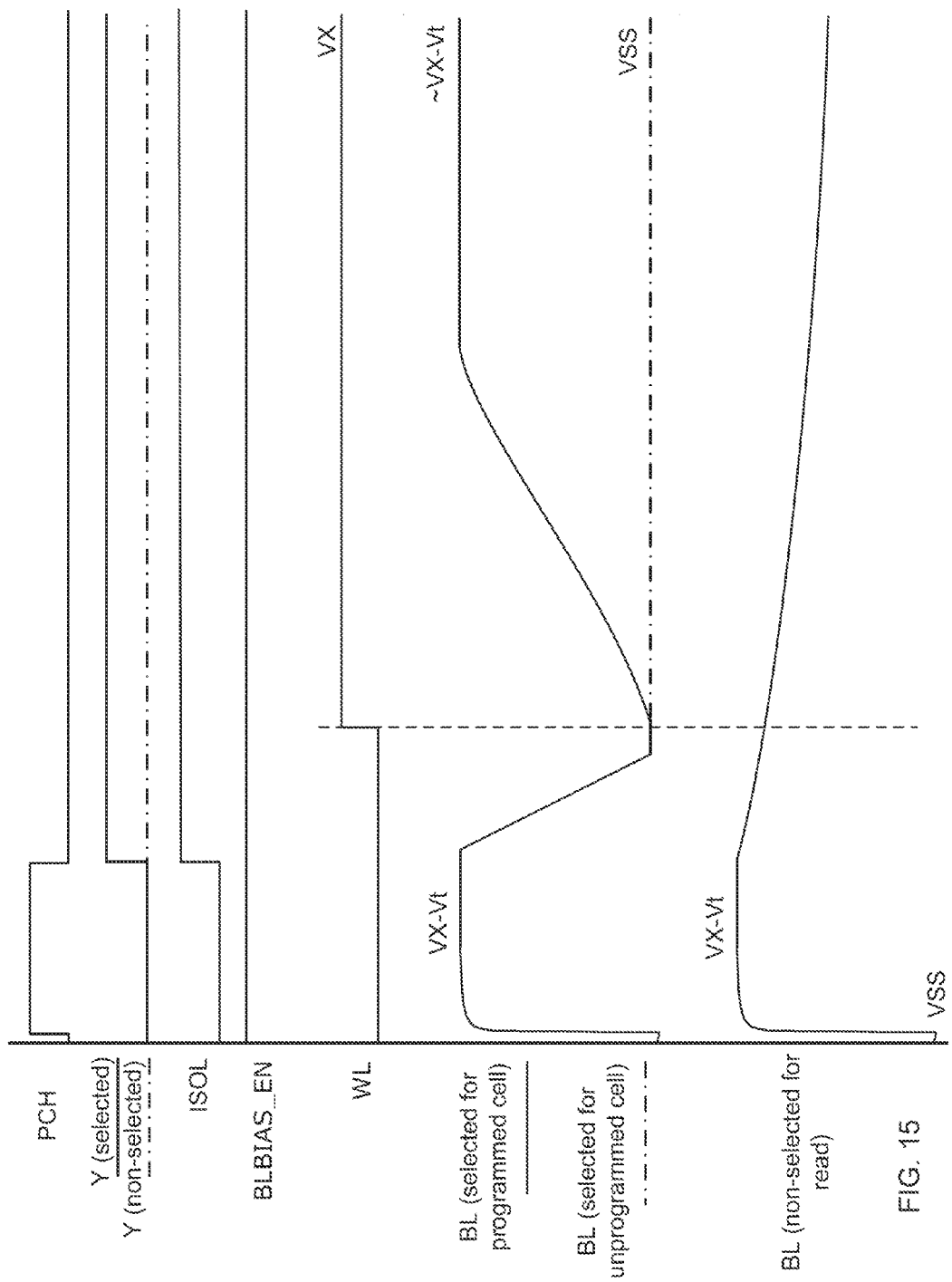

According to another embodiment of the present invention, the active precharge write disturb inhibit circuit of FIG. 10 is effective for improving aspects of read operations. As discussed above for FIG. 12, VBLBIAS can be set to VSS in a read cycle. The following discussion of a precharge operation for a read cycle makes reference to the timing diagram of FIG. 15. The timing diagram of FIG. 15 shows signal traces for PCH, selected an non-selected column select signals Y, ISOL, BLBIAS_EN, a selected wordline WL, a selected bitline BL and a non-selected bitline BL. It is noted that the timing diagram signal traces are not drawn to scale, and the bitline voltage signal traces are drawn with an enlarged scale relative to the other shown signals in order to better illustrate the voltage changes occurring therein.

Returning to the circuit 90 embodiment of FIG. 11, the P channel devices 82 are fully turned on when VBLBIAS 84 is at VSS. In the precharge operation of the read cycle, VPCH is set to about VX-Vt and PCH 53 is pulsed to precharge all the bitlines to VPCH. In FIG. 15, BLBIAS_EN remains at the high logic level during the precharge operation and for the duration of the read operation. The duration of the PCH pulse can be set for a time sufficient to quickly charge the bitlines to VPCH in the least amount of time, based on the geometry and fabrication process of the circuits. Once PCH falls to the inactive low logic level, the N channel devices 59 it is connected to are turned off. In the read operation, a column select device 55 is activated and BLSA 56 will pre-condition the selected bitline 52 by driving it to VSS. This is shown in FIG. 15 by the selected column selected signal Y being driven to the high logic level concurrently with ISOL being driven to the high logic level. As shown in FIG. 15, once the selected column select signal Y is driven to the high logic level, the selected bitline precharged to VX-Vt is driven to VSS.

At some predetermined time after the selected bitline BL has reached VSS, a selected wordline 57 is activated. This predetermined time can be simulated and/or set based on the geometry and fabrication process of the circuits. If the memory cell 51 connected to it has a conductive link formed therein, the selected bitline 52 will be driven towards the voltage of wordline 57, which can be subsequently sensed by the bitline sense amplifier 58. This is shown in FIG. 15 by the selected bitline voltage rising towards VX-Vt. Sensing can occur at any suitable time after the wordline has been activated and a sufficient voltage differential between the selected bitline and a reference voltage has developed. Once again, such timing parameters can be determined based on the circuit design and fabrication process. On the other hand, if the memory cell 51 does not have a conductive link formed therein, the selected bitline 52 remains at VSS, as shown by the dashed line remaining at VSS for an unprogrammed memory cell. It is noted that all non-selected bitlines will begin to decay, or slowly discharge towards VSS after the PCH signal is driven to the inactive low logic level. The decay slope for the non-selected bitlines is less steep than shown for the non-selected bitlines of FIG. 6 as the diagram is generally scaled for a shorter read cycle, which in some examples can be less than 100 ns. However, by precharging all the non-selected bitlines 52 to VPCH 54, the load on the selected wordline 57 is reduced as any non-selected memory cell 51 having a conductive link will not draw significant current from the activated wordline 57 as the voltage differential between the wordline voltage and the voltage of the bitline is small relative to the voltage differential between a bitline at VSS and the wordline voltage.

Accordingly, the read cycle and programming cycle are examples of a bitline access operation to access a memory cell connected to a selected bitline, which the presently active precharge circuit embodiments can be applied to.

The non-volatile memory arrays and methods described above are effective in minimizing write disturb. The APWDIC is effective to hold non-selected bitlines, and in some embodiments selected bitlines wherein no memory cell on the bitline is to be programmed, to a program inhibit voltage. While the previously disclosed embodiments of the APWDIC is operable in a high current mode and a low current mode, in an alternate embodiment, the APWDIC can operate with just the low current mode if high speed precharging is not required. It does not interfere with programming of memory cells, nor does it interfere with read operations. While the previously shown embodiments of the APWDIC include specific N channel devices, P channel devices, and voltages, the circuits can be inverted in alternate embodiments to achieve the same result. The previous embodiments use a sense amplifier for providing write data to the bitlines, which is an example of a write circuit. In alternate configurations, a separate write circuit can be included in the memory array with the sense amplifiers.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

The above-described embodiments are intended to be examples only. Alterations, modifications and variations can be effected to the particular embodiments by those of skill in the art without departing from the scope, which is defined solely by the claims appended hereto.

What is claimed is:

1. A method for accessing a memory cell of a one-time programmable (OTP) memory comprising:
   actively maintaining non-selected bitlines at a precharge voltage before executing a bitline access operation; and,
   executing the bitline access operation to access the memory cell connected to a selected bitline initially precharged to the precharge voltage;
   ending maintaining the non-selected bitlines at the precharge voltage after commencement of the bitline access operation.

2. The method of claim 1, wherein the bitline access operation is a programming operation, and the precharge voltage is a program inhibit voltage.

3. The method of claim 2, further including precharging all bitlines, including the selected bitline, to the program inhibit voltage in a precharge operation prior to maintaining the non-selected bitlines at the program inhibit voltage during the programming operation.

4. The method of claim 3, wherein the programming operation includes changing the program inhibit voltage of the selected bitline to a voltage for enabling programming of the memory cell.

5. The method of claim 4, wherein the precharge operation includes driving all the bitlines with low current and the programming operation includes driving all the bitlines with the low current.

6. The method of claim 4, wherein the precharge operation includes driving all the bitlines with high current.

7. The method of claim 6, wherein actively maintaining and the programming operation includes driving all the bitlines, including the selected bitline, with low current.

8. The method of claim 1, wherein the bitline access operation is a read operation, and the precharge voltage is a read precharge voltage.

9. The method of claim 8, wherein actively maintaining includes precharging all the bitlines for a predetermined period of time in a precharge operation prior to executing the read operation.

10. The method of claim 9, wherein executing the read operation includes driving the selected bitline from the precharge voltage to a voltage supply level.

11. The method of claim 10, wherein executing the read operation includes driving a wordline connected to the memory cell after the selected bitline is at the voltage supply level.

\* \* \* \* \*